(12) United States Patent
Richter

(10) Patent No.: US 6,504,714 B1
(45) Date of Patent: Jan. 7, 2003

(54) MULTI-LEVEL THERMAL MANAGEMENT SYSTEM AND METHOD

(75) Inventor: John T Richter, Seneca, SC (US)

(73) Assignee: Square D Company, Palatine, IL (US)

( * ) Notice: Subject to any disclaimer, the term of this patent is extended or adjusted under 35 U.S.C. 154(b) by 0 days.

(21) Appl. No.: 09/639,719

(22) Filed: Aug. 16, 2000

(51) Int. Cl.$^7$ ................................. H05K 7/20
(52) U.S. Cl. .................. 361/695; 62/259.2; 454/184
(58) Field of Search ................ 62/259.2; 361/687–690, 361/694–697, 724; 363/141, 143; 454/184

(56) References Cited

U.S. PATENT DOCUMENTS

| | | | | |
|---|---|---|---|---|
| 3,857,044 A | * | 12/1974 | Papoi et al. | 361/690 |
| 5,132,872 A | * | 7/1992 | Hase | 361/695 |
| 5,398,159 A | * | 3/1995 | Andersson et al. | 361/695 |
| 6,320,734 B1 | * | 11/2001 | Sonobe et al. | 361/695 |

* cited by examiner

Primary Examiner—Gregory Thompson
(74) Attorney, Agent, or Firm—David R. Stacey; Larry T. Shrout; Larry I. Golden

(57) ABSTRACT

A multi-level thermal management system and method are provided for cooling a plurality of vertically spaced electrical components, including a lower electrical component and an upper electrical component. The system includes a rigid support securing the upper electrical component in a fixed position above the lower electrical component. A duct, having an upper end and a lower end, an inlet defined in the lower end of the duct and an outlet defined in the upper end of the duct, is mounted adjacent to the upper electrical component with the inlet being located above the lower electrical component to direct air heated by the lower electrical component through the duct without substantially contacting the upper electrical component.

20 Claims, 3 Drawing Sheets

MULTI-LEVEL THERMAL MANAGEMENT SYSTEM AND METHOD

CROSS-REFERENCE TO RELATED APPLICATIONS

Not applicable.

STATEMENT REGARDING FEDERALLY SPONSORED RESEARCH OR DEVELOPMENT

Not applicable.

TECHNICAL FIELD

The present invention relates generally to systems for removing heat from a plurality of vertically spaced heat generating electrical components and more particularly to systems for removing heat from cabinets containing a plurality of vertically spaced heat generating electrical components.

BACKGROUND OF THE INVENTION

In the field of enclosed electrical devices, it is generally required that temperatures inside the enclosure not rise above a level determined by regulating authorities and/or established national or local codes. Since all electrical devices produce heat, some more than others, thermal issues are very important to the electrical enclosure designer. In many instances the physical size of the enclosure must be increased to accommodate the desired number of devices, or reduce the number of electrical devices inside the enclosure in order to maintain a temperature below the maximum allowable rise. Expensive cooling fans and heat sinking apparatus may also be required to obtain the desired combination of enclosure size and number of electrical devices. Therefore, it would be desirable to develop a relatively simple and inexpensive thermal management system that would permit the greatest number of electrical devices to be enclosed in the smallest or most efficient electrical enclosure without exceeding the maximum allowable temperature rise.

SUMMARY OF THE INVENTION

In accordance with the present invention, a multi-level thermal management system is provided for cooling a plurality of vertically arranged heat producing electrical devices, including a lower-most electrical device and at least one succeeding upper electrical device. The system includes one wall of an electrical enclosure on which the lower-most electrical device is mounted and at least one mounting surface on which each of the succeeding upper electrical devices are mounted. The mounting surface is arranged such that each succeeding upper electrical device is attached to the mounting surface such that the upper electrical device is positioned generally above and forward with respect to the immediately preceding lower electrical device. The mounting surface, the vertical wall of the electrical enclosure on which the lower electrical component is mounted and two side walls disposed generally perpendicularly between mounting surface and the enclosure wall define an air duct for receiving heated air from all of the preceding lower electrical devices. The air duct segregates heated air from the lower-most and all preceding lower electrical devices from cooler air being drawn through the lower-most and all succeeding upper electrical devices. Each air duct has an air inlet at its lower end and an air outlet at its upper end. The mounting surface and side walls are configured such that the air inlet of the immediately succeeding upper air duct receives the heated air from all preceding lower electrical devices, thus each succeeding upper air duct increases in cross-section. This configuration permits cool air drawn in through appropriately positioned vents in the enclosure to pass over and through the lower-most and all succeeding upper electrical devices and their associated heat sinking arrangements. This configuration provides optimum cooling for the lower most and all succeeding upper electrical devices. A fan can be located adjacent the air outlet of the uppermost air duct to increase the rate of airflow throughout the air duct.

DETAILED DESCRIPTION OF THE INVENTION

Figure 1:
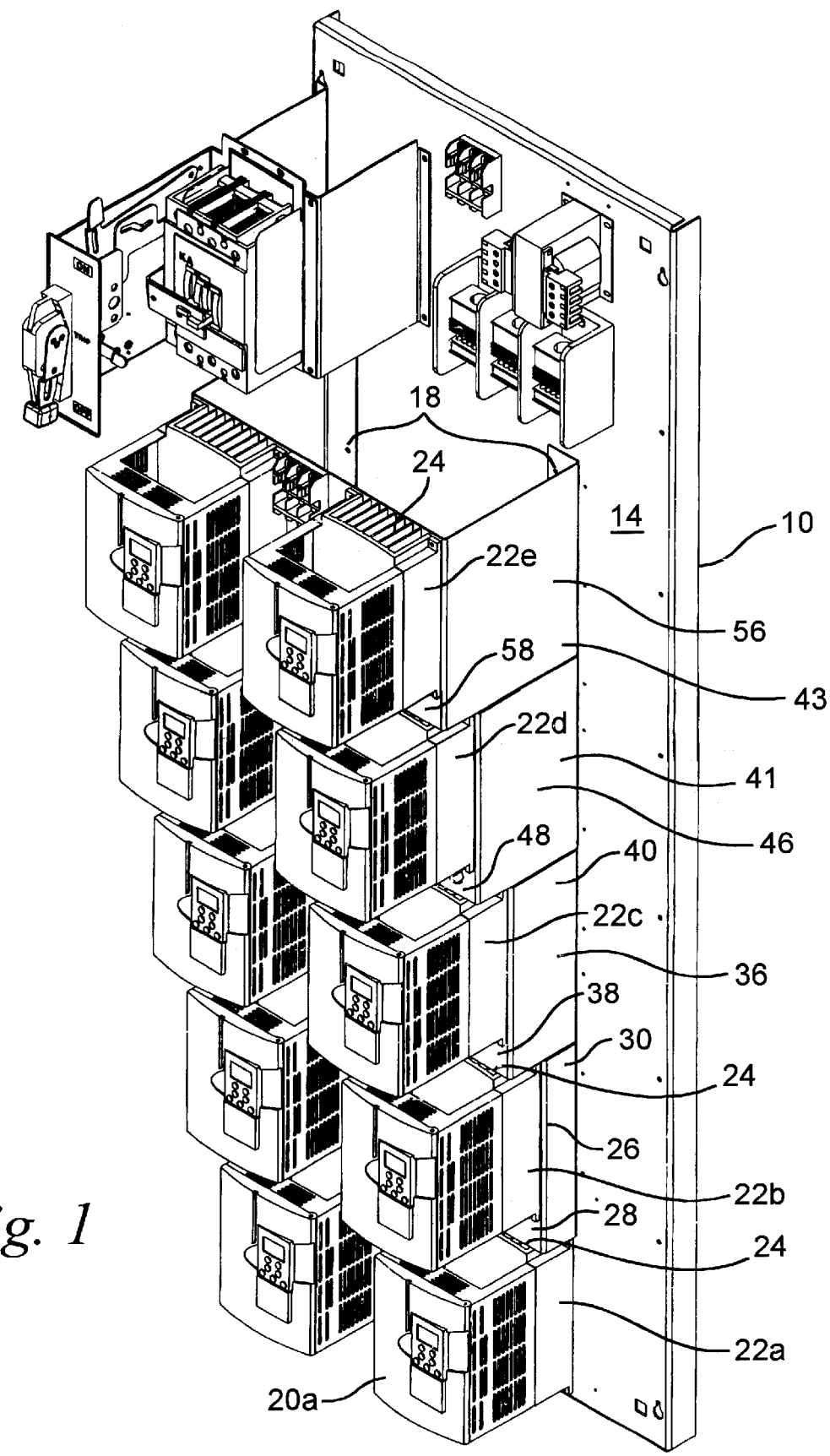
FIG. 1 is a perspective view of a partially assembled apparatus in accordance with the present invention.

Referring now to the drawings, in which like reference numerals indicate like or corresponding features, a multi-level thermal management system embodying various features of the present invention is shown generally at 8 in the figures. The thermal management system 8 includes an enclosure 12 having a plurality of electrical components mounted therein. A panel 10 forms one wall of enclosure 12 and includes a securing surface 14 located in the interior of the enclosure 12.

The electrical components, including electronic components, mounted in the enclosure 12 serve as heat sources during operation. More specifically, a lower heat generating electrical component 20a, which is an electrical component such as a motor drive, transformer or condenser, for example, is secured to the securing surface 14. The electrical component 20a can include a heat sink 22a having a plurality of conductive fins 24 positioned between the electrical component 20a and the securing surface 14. The fins 24 are parallel and arranged in a vertical orientation to permit vertical airflow through the heat sink 22a. The heat sink 22a is located immediately adjacent to the securing surface 14. Directly above the heat sink 22a, a first duct section 26 is secured to the securing surface 14.

A duct section 26 comprises a mounting platform 28, generally parallel to the securing surface 14, and two opposing side walls 30 that are secured to the securing surface 14 by welding, for example, or bolts 18. The mounting platform 28, the securing surface 14 and the side walls 30 cooperatively define the cross-sectional area of the duct section 26. The bottom end of the duct section 26 defines an inlet 32 located in a position directly above the heat sink 22a to receive air flowing upwardly through the heat sink 22a. The top end of the duct section 26 defines an outlet 34 adapted to exhaust the air passing through the duct section 26.

At least one upper electrical component 20b is secured to a rigid support member. In the depicted embodiment, the rigid support member is the mounting surface 28. The upper electrical component 20b is positioned vertically above the lower electrical component 20a, but forward with respect to the lower electrical component. The upper electrical component 20b can be a component identical to the lower electrical component 20a or it can be a different type of component. The electrical component 20b includes a heat sink 22b having a plurality of conductive fins 24 in the illustrated embodiment. The fins 24 are parallel and arranged in a vertical orientation to permit vertical airflow through the heat sink 22b. The heat sink 22b is located immediately adjacent to the mounting surface 28.

Directly above the heat sink 22b, a second duct section 36 is secured to the securing surface 14. The duct section 36 includes a mounting surface 38 that is generally parallel to the securing surface 14, and two opposing side walls 40 that are generally perpendicular to the securing surface 14 and the mounting surface 38. The mounting surface 38, the securing surface 14 and the side walls 40 cooperatively define the cross-sectional area of the duct section 36. The bottom end of the duct section 36 defines an inlet 42 located in a position directly above the heat sink 22b and the outlet 34 of the first duct section 26 to receive air flowing upwardly through the heat sink 22b and the air exiting from the duct section 26 through the outlet 34. The top end of the duct section 36 defines an outlet 44 adapted to exhaust the air passing through the duct section 36.

In a similar manner, a plurality of heat sources 20c, 20d and 20e are vertically arranged on platforms 48 and 58, respectively. Side walls 40, 41 and 43, are respectively located between the platforms 38, 48 and 58 and the securing surface 14 to provide duct sections, 36, 46 and 56, respectively, of increasing cross-sectional area.

Figure 2:
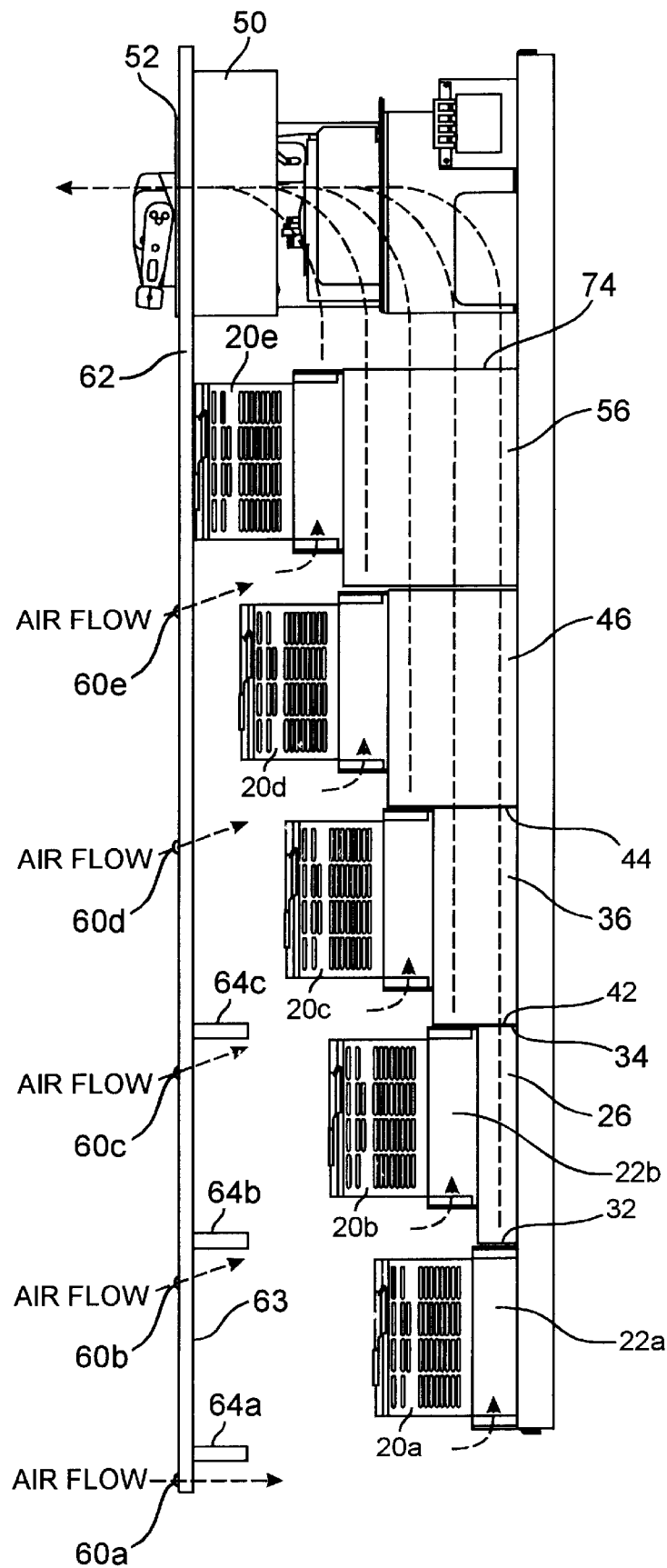
FIG. 2 is a schematic side elevation view of a partially assembled apparatus in accordance with the present invention.
Figure 3:
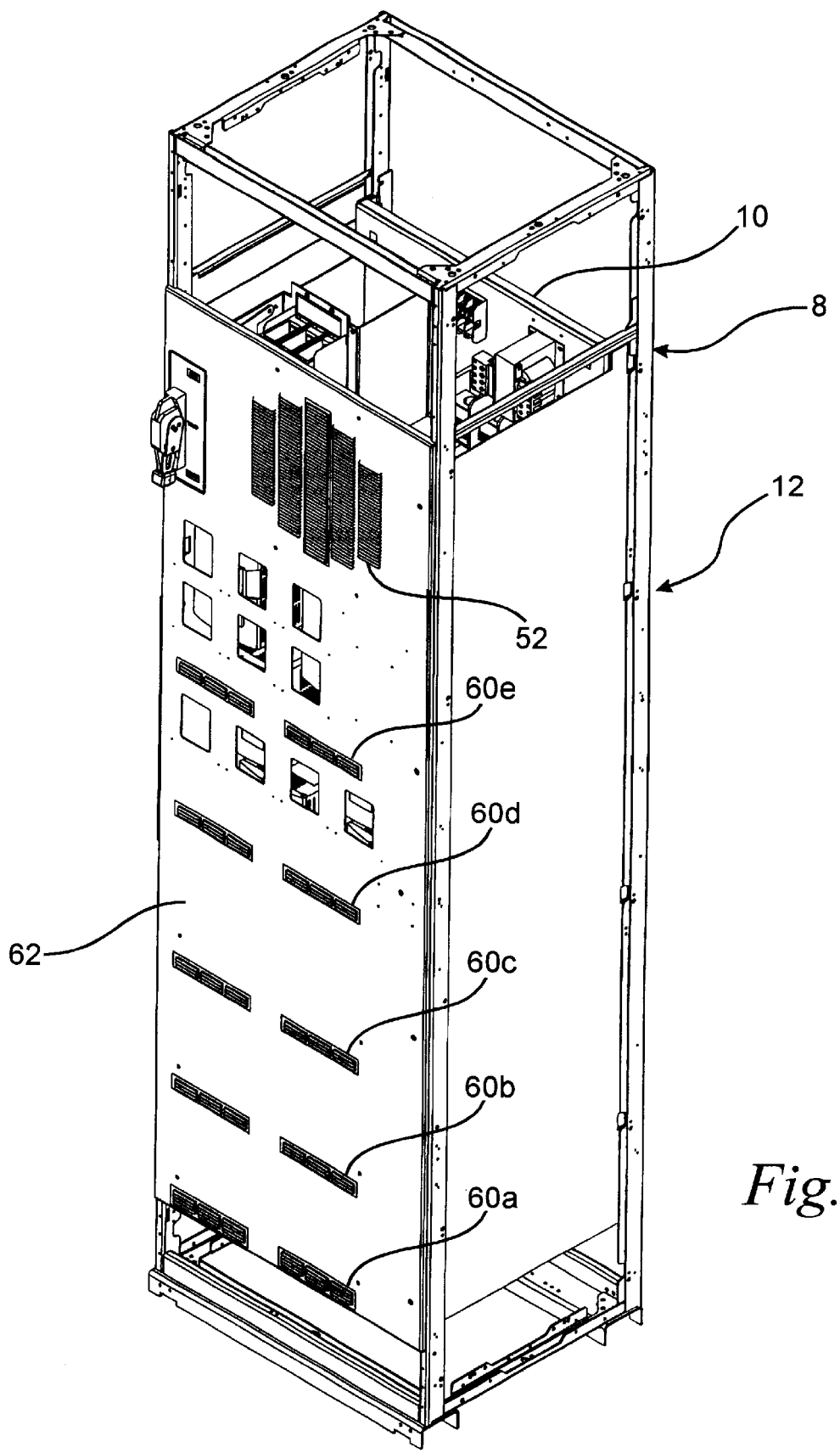
FIG. 3 is a perspective view of an apparatus in accordance with the present invention with outer panels removed from the top and bottom of the enclosure.

In the depicted embodiment, the securing surface 14 defines an interior wall of an enclosure 12, which can be fabricated from a rigid material. The enclosure 12 is intended to protect the equipment mounted therein from dust and damage, to provide a framework for supplying electrical lines, for example, and to protect operators from unintentional contact with the equipment. A plurality of vents 60a, 60b, 60c, 60d and 60e are defined in the door 62, located in opposition to the securing surface 14. Each of the vents 60a, 60b, 60c, 60d and 60e is located at a height below the height of one of the electrical components 20a, 20b, 20c, 20d and 20e, respectively, to provide independent supplies of ambient air to the interior of the enclosure in close proximity to the respective electrical component. As shown particularly in FIG. 2, a plurality of planar baffles 64a, 64b and 64c are secured to the interior surface 63 of the door 62 to laterally direct the ambient air entering each of the vents 60a, 60b and 60c to the respective electrical components 20a, 20b and 20c.

An exhaust fan 50 is provided to increase the rate of air flow upwardly through the duct in the direction of the increasing cross-sectional area. To this end, air is moved past each of the heat-generating components to draw heat therefrom. More specifically, in the illustrated embodiment, the fan 50 is mounted upon the interior surface 63 of the door 62 adjacent to the top of the door 62 and an exhaust vent 52 is defined in the door 62 adjacent to the fan 50. The fan 50 is located at a height above the uppermost duct 56 to force air out of the enclosure 12, developing a negative air pressure within the duct sections 26, 36, 46 and 56. Optionally, the fan 50 may be located in another position within the desired path of air flow.

In operation, the electrical components 20a, 20b, 20c, 20d and 20e receive electrical energy in order to operate in their intended manner. The operation of the electrical components 20a, 20b, 20c, 20d and 20e generates heat that is absorbed by the heat sinks 22a, 22b, 22c, 22d and 22e, respectively, and radiated to air passing thereby. The negative air pressure developed by the operation of the fan 50 draws ambient air through the vent 60a, laterally across the enclosure, over the electrical component 20a and into the heat sink 22a. The ambient air is heated as it passes through the electrical component 20a and heat sink 22a, removing the heat generated by the electrical component 20a. The warmed air then enters the inlet 32 of the first duct section 26 and passes upwardly through the duct sections 26, 36, 46 and 56 to the outlet 74 of the top duct section 56. The fan 50 then exhausts the heated air through the exhaust vent 52 to the ambient environment. The ambient air, used to cool the electrical component 20a and then directed into and through duct sections 26, 36, 46 and 56, does not contact any of the electrical components 20b, 20c, 20d and 20e located above the electrical component 20a.

Similarly, ambient air is drawn through the vent 60b, laterally across the enclosure 12, over the electrical component 20b and into the heat sink 22b. The ambient air is heated as it passes through the electrical component 20b and heat sink 22b, removing the heat generated by the electrical component 20b. The warmed air then enters the inlet 42 of the second duct section 36 and passes upwardly through the duct sections 36, 46 and 56 to the outlet 74 of the top duct section 56. The fan 50 then exhausts the heated air through the exhaust vent 52 to the ambient environment. The ambient air used to cool the electrical component 20b and then directed into and through the duct sections 36, 46 and 56 does not contact any of the electrical components 20c, 20d and 20e located above the electrical component 20b.

The remaining electrical components 20c and 20d are cooled in similar manners and the heated air from each electrical component 20c and 20d is collected in the duct sections 46 and 56, respectively, and then exhausted by the fan 50. The heated air exiting from the heat sink 22e is drawn directly by the fan 50 and forced out through the exhaust vent 52.

It will be recognized by those skilled in the art that various modifications may be made in the depicted embodiment within the spirit and scope of the present invention. For example, each of the electrical components 20a, 20b, 20c, 20d and 20e includes a heat sink 22a, 22b, 22c, 22d and 22e, respectively. Under some conditions heat sinks may not be required if the airflow around the electrical components provides sufficient contact for adequate heat transfer from the electrical components to the air.

The duct sections have been described herein as separate sections. They may comprise separate modules assembled to form a single unit or they may be fabricated as a single continuous unit. Alternatively, each electrical component may be provided with an individual duct providing flow communication for heated air between each electrical component and the exhaust vent.

In the depicted embodiment, each mounting surface is a portion of a duct section. Alternatively, the mounting surfaces can be structures separate from the duct sections.

Employing the present invention, it becomes feasible to mount many electrical components within a single enclosure and maintain an internal temperature that does not exceed the maximum allowable temperature rise. The relative sizes of the inlets and vents can be adjusted to accommodate electrical components generating differing amounts of heat. The rate of airflow through the enclosure will be dependent upon the rate at which heat is being generated in the enclosure and the temperature differential between the ambient air and the electrical components. Also, as shown in the drawings, multiple electrical components can be mounted side by side on a single mounting surface. Cooling air will generally not pass over more than one electrical component in its path from a vent to a duct section for removal.

While one embodiment has been shown and described, it will be understood that it is not intended to limit the disclosure, but rather is intended to cover all modifications and alternate methods and apparatus within the spirit and scope of the invention.

I claim:

1. A multi-level thermal management system for cooling a plurality of vertically spaced electrical components, including at least a lower electrical component and an upper electrical component, said system comprising:
   a securing surface on which said lower electrical component is mounted; and
   a duct section attached to said securing surface immediately above said lower electrical component and defining a mounting surface generally parallel to and forward with respect to said securing surface, said upper electrical component being mounted on said mounting surface, said duct section segregating cooling air applied to and warmed by said lower electrical component from cooling air applied to said upper electrical component.

2. A system in accordance with claim 1 wherein said upper and lower electrical components and said duct section are located inside an enclosure, said securing surface being a wall of said enclosure.

3. A system in accordance with claim 2 wherein said enclosure further includes a cover having at least one exit vent for removing heated air, and at least one inlet vent associated with each electrical component for the ingress of cooling air for the associated electrical component.

4. A system in accordance with claim 1 wherein a fan may be provided in the airflow path for increasing the volume of cooling air entering the inlet vents.

5. A system in accordance with claim 1 wherein additional upper electrical components and additional duct sections can be added vertically to said system.

6. A system in accordance with claim 5 wherein a mounting surface of each said additional duct section is positioned such that each said additional upper electrical component is located above and forward with respect to an immediately adjacent lower electrical component.

7. A multi-level thermal management system for cooling a plurality of vertically spaced electrical components, including a lower electrical component and a plurality of upper electrical components, said system comprising:
   a securing surface on which said lower electrical component is mounted; and
   a plurality of duct sections each being mounted on said securing surface in succeeding ascending order above said lower electrical component, each immediately succeeding ascending duct section defining a mounting platform generally parallel to and increasingly forward with respect to said securing surface and said mounting platform of the immediately preceding descending said duct section, each of said plurality of upper electrical component being mounted on one of said mounting platforms such as to be above and forward of said lower electrical component and all preceding said upper electrical components, each succeeding ascending said duct section segregating cooling air applied to and warmed by said lower electrical component and all preceding said upper electrical components from cooling air applied to all succeeding said upper electrical components.

8. The system of claim 7 wherein said plurality of electrical components are vertically arranged inside an enclosure.

9. The system of claim 8 wherein said securing surface is a wall of said enclosure.

10. The system of claim 8 wherein said enclosure includes vertically spaced vents located at a positions generally coinciding with each said electrical component.

11. The system of claim 7 wherein a fan can be mounted inside said enclosure at a position which will increase airflow through said plurality of duct sections.

12. A multi-level thermal management system for cooling a plurality of vertically arranged electrical components mounted inside an enclosure, said system comprising:
   a securing surface of said enclosure on which a lowest one of said plurality of vertically arranged electrical component is mounted; and
   a plurality of duct sections each being mounted on said securing surface in succeeding ascending order above said lowest one of said plurality of vertically arranged electrical component, each immediately succeeding ascending duct section defining a mounting platform generally parallel to and increasingly forward with respect to said securing surface and said mounting platform of the immediately preceding descending said duct section, one of said plurality of vertically arranged electrical component being mounted on each of said mounting platforms such as to be above and forward of said lowest one of said vertically arranged electrical component and all preceding said vertically arranged electrical components, each succeeding ascending said duct section segregating cooling air applied to and warmed by said lowest one of said plurality of vertically arranged electrical component and all preceding said vertically arranged electrical components from cooling air applied to all succeeding ascending said vertically arranged electrical components.

13. The system of claim 12 wherein said securing surface is a wall of said enclosure.

14. The system of claim 12 wherein a fan can be mounted inside said enclosure at a position which will increase airflow through said plurality of duct sections.

15. The system of claim 12 wherein said enclosure includes a plurality of vertically spaced vents, each being located at a position generally coinciding with one of said plurality of electrical component.

16. The system of claim 15 wherein a plurality of baffles, each being attached to said enclosure adjacent one of said plurality of vents, are positioned such as to direct ambient air entering through said vents toward their associated electrical component.

17. A method of cooling a plurality of electrical component arranged vertically in an enclosure, said method comprising the steps of:
   securing one of said plurality of electrical components to a securing surface of said enclosure;
   securing a plurality of succeeding duct sections to said securing surface of said enclosure above said one of said plurality of electrical components attached to said securing surface, each succeeding duct section having a mounting platform generally parallel to said securing surface and defining a wall of said duct section, said mounting platform of immediately succeeding ascend ing said duct sections being horizontally spaced from said mounting platform of immediately preceding said duct section such that each succeeding ascending duct section has a larger cross-sectional area;

securing one of said plurality of electrical component to said mounting platform of each said duct section; and collecting air heated by each preceding descending said electrical component in an immediately ascending succeeding said duct section such that air heated by any preceding said electrical component does not contact any succeeding ascending electrical component.

18. The method of claim 17 further comprising the step of drawing air through said plurality of duct sections with a fan mounted inside said enclosure.

19. The method of claim 17 further comprising the step of collecting air heated by a plurality of electrical components in a common duct defined by said plurality of duct sections.

20. The method of claim 19 further comprising the step of drawing air through said common duct with a fan mounted inside said enclosure.

* * * * *